United States Patent
Hong et al.

(10) Patent No.: US 12,486,428 B2
(45) Date of Patent: Dec. 2, 2025

(54) POLISHING PAD AND METHOD FOR MANUFACTURING SEMICONDUCTOR DEVICE USING SAME

(71) Applicant: SK enpulse Co., Ltd., Gyeonggi-do (KR)

(72) Inventors: Seung Chul Hong, Seoul (KR); Deok Su Han, Seoul (KR); Han Teo Park, Seoul (KR); Kyu Hun Kim, Gyeonggi-do (KR); Eun Sun Joeng, Gyeonggi-do (KR); Jang Kuk Kwon, Seoul (KR); Hyeong Ju Lee, Seoul (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 533 days.

(21) Appl. No.: 17/870,333

(22) Filed: Jul. 21, 2022

(65) Prior Publication Data
US 2023/0040931 A1    Feb. 9, 2023

(30) Foreign Application Priority Data

Jul. 22, 2021  (KR) .......................... 10-2021-0096258

(51) Int. Cl.
*C09G 1/02*     (2006.01)
*H01L 21/321*   (2006.01)

(52) U.S. Cl.
CPC ............ *C09G 1/02* (2013.01); *H01L 21/3212* (2013.01)

(58) Field of Classification Search
CPC .......... C09K 13/00; C09K 13/06; C09G 1/02; H01L 21/304; H01L 21/3065; H01L 21/3212; H01L 2224/03616; H01L 2224/03845; H01L 2224/11616; H01L 2224/11845; H01L 2224/27616
See application file for complete search history.

(56) References Cited

U.S. PATENT DOCUMENTS

| | | |
|---|---|---|
| 9,127,187 B1 | 9/2015 | Grumbine et al. |
| 2012/0156874 A1 | 6/2012 | Han et al. |
| 2013/0313225 A1 | 11/2013 | Jin et al. |
| 2015/0376462 A1 | 12/2015 | Fu et al. |
| 2017/0183539 A1* | 6/2017 | Kwon .................. H01L 21/3212 |
| 2019/0292406 A1* | 9/2019 | Cho .......................... C09G 1/04 |
| 2021/0115296 A1 | 4/2021 | Kim et al. |

FOREIGN PATENT DOCUMENTS

| | | |
|---|---|---|
| CN | 102585704 A | 7/2012 |
| CN | 111378375 A | 7/2020 |
| EP | 4086312 A1 | 11/2022 |
| JP | 2009-290126 A | 12/2009 |
| JP | 2010-541203 A | 12/2010 |
| JP | 2014-505358 A | 2/2014 |
| JP | 2015-522669 A | 8/2015 |
| JP | 2019-029660 A | 2/2019 |
| JP | 2019-143119 A | 8/2019 |
| JP | 2021-068898 A | 4/2021 |
| KR | 10-2012-0068575 A | 6/2012 |
| KR | 10-2018-0073131 A | 7/2018 |
| KR | 10-2018-0073384 A | 7/2018 |
| TW | 200940693 A | 10/2009 |

OTHER PUBLICATIONS

Extended European Search Report for the European Patent Application No. 22186205.5 issued by the European Patent Office on Jan. 5, 2023.

* cited by examiner

*Primary Examiner* — Pegah Parvini
(74) *Attorney, Agent, or Firm* — IP & T GROUP LLP (57) ABSTRACT

Provided is a polishing composition for a semiconductor process comprising abrasive particles, the abrasive particles containing an amine-based polishing rate improver, and comprising the amine-based polishing rate improver. Provided is a polishing composition for a semiconductor process further comprising an amine-based surface modifier around the surface of the abrasive particles, wherein the sum of the content of an amine group contained in the amine-based polishing rate improver and the content of an amine group contained in the amine-based surface modifier is 0.0185% by weight or more based on the total composition weight. The polishing composition for a semiconductor process may implement the polishing rate and defect prevention performance within a target range in polishing the boron-doped polysilicon layer.

13 Claims, 2 Drawing Sheets

POLISHING PAD AND METHOD FOR MANUFACTURING SEMICONDUCTOR DEVICE USING SAME

CROSS-REFERENCE TO RELATED APPLICATION(S)

This application claims priority to Korean Patent Application No. 10-2021-0096258, filed on Jul. 22, 2021, the disclosure of which is incorporated herein by reference in its entirety.

TECHNICAL FIELD

The present disclosure relates to a polishing pad applied to a chemical mechanical planarization process of a semiconductor substrate as a part of a semiconductor device manufacturing process, and a method for manufacturing a semiconductor device by applying the same.

DESCRIPTION OF THE RELATED ART

A chemical mechanical planarization (CMP) or chemical mechanical polishing (CMP) process is used for various purposes in various fields. The CMP process is performed on a predetermined polishing surface of a polishing target, and may be performed for the purposes of planarization of the polishing surface, removal of aggregated materials, resolution of crystal lattice damage, removal of scratches and contaminants, etc.

The CMP process technology of the semiconductor process may be classified depending on the quality of a polishing target film or the surface shape after polishing. For example, it may be divided into single silicon or polysilicon depending on the polishing target film, and may be classified into CMP processes of various oxide films divided depending on the type of impurities, or CMP processes of metal films such as tungsten (W), copper (Cu), aluminum (Al), ruthenium (Ru), tantalum (Ta), etc. In addition, depending on the surface shape after polishing, it may be classified into a process of alleviating the roughness of the substrate surface, a process of flattening a step difference caused by multilayer circuit wiring, and an element isolation process for selectively forming circuit wiring after polishing.

The CMP process may be applied in plurality in the process of manufacturing a semiconductor device. The semiconductor device includes a plurality of layers, and each layer contains a complex and fine circuit pattern. Further, in recent semiconductor devices, individual chip sizes are reduced, and the patterns of each layer are evolving in a direction of becoming more complex and finer. Accordingly, in the process of manufacturing the semiconductor device, the purpose of the CMP process has been expanded to not only the purpose of planarizing circuit wiring, but also the purpose of applying separation of circuit wiring and improvement of a wiring surface, and as a result, more sophisticated and reliable CMP performance is required.

A polishing pad used in such a CMP process is a process component that processes a polishing surface to a required level through friction, and may be viewed as one of the most important factors in the thickness uniformity of the polishing target after polishing, flatness of the polishing surface, and polishing quality.

SUMMARY

An object of the present disclosure is to provide a polishing composition for a semiconductor process and a method for manufacturing a semiconductor device to which the polishing composition is applied.

Another object of the present disclosure is to provide a polishing composition for a semiconductor process, which limits the size of abrasive particles contained in the polishing composition and has physical properties such as pH and zeta-potential.

Another object of the present disclosure is to provide a polishing composition for a semiconductor process, which improves the polishing rate and prevents the occurrence of defects by appropriately adjusting the quality of a boron-doped film and the degree of adsorption of the polishing composition for the semiconductor process using the electrical properties of the polishing composition for the semiconductor process during the polishing process.

Another object of the present disclosure is to provide a polishing composition for a semiconductor process, which has high process efficiency in a polishing process of a semiconductor substrate.

Another object of the present disclosure is to provide a method for manufacturing a semiconductor device, which, when the boron-doped film is polished, allows it to have a higher polishing rate than a conventional polishing composition for a semiconductor process, and suppresses defects to the lowest level at the same time.

A polishing composition for a semiconductor process according to one embodiment of the present disclosure is a polishing composition comprising: water, abrasive particles; and an amine-based polishing rate improver, wherein the polishing composition contains 0.0185% by weight or more of an amine group based on the total weight of the polishing composition.

The abrasive particles according to one embodiment of the present disclosure have an amine-based surface modifier bonded to the surface thereof, and have a sum of the content of an amine group contained in the amine-based polishing rate improver and the content of an amine group contained in the amine-based surface modifier of 0.0185% by weight or more based on the total composition weight.

The polishing composition according to one embodiment of the present disclosure has a pH of 4 or less and a zeta potential of 15 mV to 33 mV.

The polishing composition according to one embodiment of the present disclosure has a polishing strength index (PSI) represented by the following Equation 1 of 0.6 to 5:

$$PSI = \frac{ZP}{20\ mV} \times \frac{AC1}{0.01\ wt\ \%} \times \frac{AC2}{0.01\ wt\ \%} \qquad [\text{Equation 1}]$$

where,

ZP is a zeta potential of the polishing composition,

AC1 is an amount of the amine group contained in the amine-based surface modifier in weight percent based on the total composition weight, and AC2 is an amount of the amine group contained in the amine-based polishing rate improver in weight percent based on the total composition weight.

The polishing composition according to one embodiment of the present disclosure may further comprise a silicon nitride inhibitor and a surfactant.

The abrasive particles according to one embodiment of the present disclosure have an average particle diameter of 30 nm to 50 nm and a viscosity of 1.20 cps to 1.40 cps.

The polishing composition according to one embodiment of the present disclosure may be used in a polishing process of a semiconductor substrate including a boron-doped polysilicon layer.

A method for manufacturing a semiconductor device according to one embodiment of the present disclosure may comprise steps of: providing a semiconductor substrate including a boron-doped polysilicon layer; preparing a polishing composition for a semiconductor process comprising: water; abrasive particles; and an amine-based polishing rate improver, and containing 0.0185% by weight or more of an amine group; and polishing the boron-doped polysilicon layer using the polishing composition.

In the method for manufacturing a semiconductor device according to one embodiment of the present disclosure, when the polishing process is performed using the polishing composition, the boron-doped polysilicon layer has a polishing rate of 1,000 Å/min or more.

The semiconductor substrate according to the method for manufacturing a semiconductor device according to one embodiment of the present disclosure includes a silicon nitride film, and when the polishing process is performed using the polishing composition, the silicon nitride film has a polishing rate of 100 Å/min or less.

The polishing composition for a semiconductor process of the present disclosure comprises the amine-based polishing rate improver, and has 0.0185% by weight or more of the amine group based on the total composition weight. Therefore, the polishing composition for the semiconductor process exhibits appropriate electrical properties, and may exhibit a polishing rate within the target range in polishing the polishing target due to such properties.

Further, the composition for the semiconductor process has a polishing strength index within a specific range, thereby increasing the degree of adsorption to a polishing target during a polishing process, and exhibiting improved polishing rate and improved polishing performance.

The method for manufacturing a semiconductor device using the composition for the semiconductor process has high process efficiency for polishing a semiconductor substrate that is a polishing target. Further, the surface to be polished of the semiconductor substrate has high polishing flatness, and the occurrence of defects can be suppressed to the lowest level.

DESCRIPTION OF SPECIFIC EMBODIMENTS

Hereinafter, embodiments of the present disclosure will be described in detail so that those of ordinary skill in the art to which the present disclosure pertains can easily carry out the present disclosure. However, the present disclosure may be embodied in various different forms and is not limited to the embodiments described herein.

In the present specification, when a certain element "includes" other element, this means that another element can be further included instead of excluding other elements unless any particularly opposite description exists.

In the present specification, when an element is "connected" with other element, it not only includes a case that the element is 'directly connected' to the other element, but also includes a case that the element is 'connected to the other element with another element being interposed in the middle therebetween'.

In the present specification, the meaning that B is positioned on A means that B is positioned so that it directly abuts on A or that B is positioned on A while another layer is positioned in therebetween, and it is not construed as being limited to that B is positioned so that it abuts on the surface of A.

In the present specification, a term of "a combination thereof" included in a Markush type expression, which means a mixture or combination of one or more selected from the group consisting of elements described in the Markush type expression, means including one or more selected from the group consisting of the elements.

In the present specification, description of "A and/or B" means "A, B, or A and B".

In the present specification, terms such as "first", "second" or "A" and "B" are used to distinguish the same terms from each other unless otherwise specified.

In the present specification, the singular expression is to be construed as meaning including the singular or the plural as interpreted in context unless otherwise specified.

In the present specification, "hydrogen" is hydrogen, light hydrogen, deuterium, or tritium.

In the present specification, "alkyl" refers to a monovalent substituent derived from a straight or branched chain saturated hydrocarbon having 1 to 40 carbon atoms. Examples thereof may include methyl, ethyl, propyl, isobutyl, sec-butyl, pentyl, iso-amyl, hexyl, and the like, but are not limited thereto.

In the present specification, "alkenyl" refers to a monovalent substituent derived from a straight or branched chain unsaturated hydrocarbon having 2 to 40 carbon atoms having one or more carbon-carbon double bonds. Examples thereof may include vinyl, allyl, isopropenyl, 2-butenyl, and the like, but are not limited thereto.

In the present specification, "alkynyl" refers to a monovalent substituent derived from a straight or branched chain unsaturated hydrocarbon having 2 to 40 carbon atoms having one or more carbon-carbon triple bonds. Examples thereof may include ethynyl, 2-propynyl, and the like, but are not limited thereto.

In the present specification, "cycloalkyl" refers to a monovalent substituent derived from a monocyclic or polycyclic non-aromatic hydrocarbon having 3 to 40 carbon atoms. Examples of such cycloalkyl may include cyclopropyl, cyclobutyl, cyclopentyl, cyclohexyl, norbornyl, adamantine, and the like, but are not limited thereto.

Hereinafter, the present disclosure will be described in more detail.

The polishing composition for a semiconductor process according to one embodiment of the present disclosure comprises water and comprises abrasive particles.

The abrasive particles are, as metal oxide particles that can be applied to the polishing composition for a semiconductor process, may be selected from the group consisting of, for example, colloidal silica, fumed silica, ceria, alumina, titania, zirconia, and mixtures thereof, but are not limited to the examples, and any metal oxide particles selectable by those skilled in the art may be used without limitation.

The abrasive particles may be specifically selected from the group consisting of colloidal silica, fumed silica, alumina, titania, zirconia, inorganic composite particles, organic-inorganic composite particles, ceria, and mixtures thereof.

Specifically, the abrasive particles may be contained in an amount of 3% by weight to 20% by weight, preferably 5% by weight to 15% by weight, and more preferably 7% by weight to 12% by weight, based on the total weight of the polishing composition for a semiconductor process, but are not limited thereto. When the % by weight of the abrasive particles satisfies the above-described range, it is possible to have dispersion stability capable of securing excellent polishing performance while minimizing scratches occurring on an object to be polished. Specifically, when it is within the above range, as the occurrence of scratches on the object to be polished is prevented, it is possible to prevent problems which the quality of the object to be polished is deteriorated, or performance such as polishing rate or polishing flatness is deteriorated.

That is, the abrasive particles satisfy the above-mentioned range based on the total weight of the polishing composition for a semiconductor process so that the prepared polishing composition for a semiconductor process not only can minimize scratches occurring on the object to be polished, but also has excellent polishing rate, thereby facilitating planarization of materials requiring high surface flatness such as silicon wafers for semiconductor devices.

The amine-based surface modifier bonded to the surface of the abrasive particles is specifically a silane compound substituted with an amine group, and is bonded to the surface of the abrasive particles to enable a high level of negative charge value to be substituted with a certain level of positive charge. When the amine group bonded to the surface of the abrasive particles comes into contact with the surface of the boron-doped polysilicon, surface corrosion of the boron-doped polysilicon may be accelerated by catalysis. Further, it is possible to adjust the roughness of the surface of the boron-doped silicon wafer to a very low level (less than 20 Å) while abrasive particles physically perform abrasive action.

In the case of a boron-doped polysilicon film (BDPSi) in which boron is used as a dopant, physical strength increases as the content of boron increases so that there is a problem in that the polishing rate is relatively very low when performing the CMP process. In order to solve such a problem, an additive containing an amine group was used in the conventional polishing composition. However, as described above, when an amine compound is added in the form of an additive, a chemical reaction occurs partially on the wafer, and thus defects and variations in the polishing rate may occur on the wafer.

The boron-doped polysilicon film (BDPSi) in which boron is used as a dopant is one in which group 13 boron is added as an impurity, and at this time, boron may be contained in an addition amount of $10^{15}$ to $10^{19}/cm^3$.

Amino silane may be bonded to the particle surface of the abrasive particles so that it may be bonded thereto as the following functional groups:

[Chemical Formula 1]

where,
* means a portion bonded to the surface of the metal oxide particles, $R_1$ and $R_2$ are the same as or different from each other, and each independently selected from the group consisting of hydrogen, a substituted or unsubstituted $C_1$-$C_{10}$ alkyl group, a substituted or unsubstituted $C_3$-$C_{10}$ cycloalkyl group, a substituted or unsubstituted $C_2$-$C_{10}$ alkenyl group, and a substituted or unsubstituted $C_2$-$C_{10}$ alkynyl group, and L1 is selected from the group consisting of a substituted or unsubstituted $C_1$-$C_{10}$ alkylene group, a substituted or unsubstituted $C_2$-$C_{10}$ alkenylene group, a substituted or unsubstituted $C_2$-$C_{10}$ alkynylene group, and a substituted or unsubstituted $C_3$-$C_{10}$ cycloalkylene group.

Specifically, $R_1$ and $R_2$ may be the same as or different from each other, and may each independently be a $C_1$-$C_{10}$ alkyl group, and $L_1$ may be a substituted or unsubstituted $C_1$-$C_{10}$alkylene group.

The amino silane may be exemplarily any one selected from the group consisting of 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopmpylrimethoxysilane, N-[3-(trimethoxysilyl)propyl]butylamine, and combinations thereof.

Specifically, the amino silane used in order to be bonded to the surface of the abrasive particles may be 3-aminopropyltriethoxysilane, but it is not limited to the above example, and any amino silane capable of preventing the polishing rate and surface defects of boron-doped silicon wafers can be used without limitation.

The amine-based surface modifier may be contained in an amount of 0.01% by weight to 0.5% by weight, preferably 0.15% by weight to 0.4% by weight, and more preferably 0.015% by weight to 0.3% by weight, based on the total weight of the polishing composition for a semiconductor process. When the amine-based surface modifier is contained within the above range, it can bind to the surface of the abrasive particles and exhibit a sufficient polishing rate for the boron-doped polysilicon film. Further, it comprises an amino silane compound at a level that prevents adsorption on the wafer surface. Therefore, it is possible to prevent defects that may occur by adsorbing the amino silane compound on the wafer surface.

Further, in order to adjust the surface roughness of the boron-doped polysilicon film to a very low level of less than 20 Å while the physically surface-modified abrasive particles perform abrasive action, there is a case that while performing a catalytic action between the surface of the abrasive particles and the target film, the range or size of the catalytic reaction should be increased depending on the roughness degree of the target film.

In this case, the catalytic reaction on the surface of the modified particles may not be sufficient to control the roughness of the entire wafer area. That is, it cannot exhibit a very low level of surface roughness as in the present disclosure. In order to solve this problem, an additional additive is required in addition to the surface-modified particles when preparing the polishing composition for a semiconductor process.

The polishing composition for a semiconductor process according to one embodiment may comprise an amine-based polishing rate improver. The sum of the amount of the amine group contained in the amine-based polishing rate improver and the amount of the amine group contained in the amine-based surface modifier may be 0.0185% by weight or more based on the total composition weight.

Specifically, the content of the amine group may be 0.0185% by weight to 0.0550% by weight, 0.0190% by weight to 0.0500% by weight, 0.0193% by weight to 0.0450% by weight, or 0.0195% by weight to 0.037% by weight, based on the total weight of the polishing composition, but is not limited thereto. The polishing composition for a semiconductor process in which the content of the amine group satisfies the above-described range may secure performance capable of improving the polishing rate while minimizing scratches occurring on the object to be polished. Specifically, the boron-doped polysilicon film contains boron as an impurity, but exhibits a negative charge, and the amine-based polishing rate improver exhibits a positive charge due to the amine group, thereby causing bonding. Due to the surface protection effect by the bonding, it is possible to prevent foreign substances from being adsorbed to the polysilicon film during the polishing process, thereby preventing the occurrence of defects such as scratches.

Further, the polysilicon film forms a Si—OH or Si—O—Si bond when in contact with water, and the bond forms an Si—N bond by an amine group in the amine-based polishing rate improver, and the —OH group causes a condensation reaction by $H_2O$. The Si—N bond formed by the condensation reaction moves electrons toward the amine, thereby weakening the Si—Si bond in the polysilicon film to enable the polishing rate to be improved.

The polishing rate improver may be more specifically selected from the group consisting of glycine, β-alanine betaine, stearyl betaine, and mixtures thereof, and is preferably glycine, but is not limited to the examples.

The polishing rate improver is contained in the polishing composition together with the abrasive particles to which the amine-based surface modifier is previously bonded so that it may increase the polishing rate for the boron-doped polysilicon film and exhibit a very low level of surface roughness.

The polishing rate improver may be contained in an amount of 0.03 to 0.095% by weight, preferably 0.05 to 0.08% by weight, based on the total weight of the polishing composition for a semiconductor process. When used by mixing within the above range, it not only can exhibit a high etching rate for the boron-doped polysilicon film, but also can adjust the polishing selectivity with the silicon nitride film.

The polishing composition for a semiconductor process according to one embodiment of the present disclosure may have a pH of 1.8 to 5, a pH of 2.2 to 4.5, a pH of 2.3 to 4, or a pH of 2.35 to 2.5, and the polishing composition for a semiconductor process according to one embodiment may have a zeta potential of 15 mv to 33 mV, 17 mv to 30 mV, 20 mv to 27 mV, or 21 mv to 25 mV.

The polishing composition for a semiconductor process satisfying the above-mentioned range for the pH may improve the polishing rate when polishing the layer to be polished since the degree of adsorption to the boron-doped polysilicon layer having a relatively large negative charge is large. The zeta potential may be used as data for quantifying the dispersion degree of the abrasive particles. The polishing composition of the polishing composition for a semiconductor process, in which the zeta potential satisfies the above-mentioned range, has appropriate dispersion stability so that the abrasive particles are suitable during polishing of the object to be polished, thereby securing performance capable of improving the polishing rate while minimizing scratches.

The polishing composition for a semiconductor process according to one embodiment of the present disclosure may have a polishing strength index (PSI) represented by the following Equation 1 of 0.6 to 5:

$$PSI = \frac{ZP}{20 \text{ mV}} \times \frac{AC1}{0.01 \text{ wt \%}} \times \frac{AC2}{0.01 \text{ wt \%}} \qquad \text{[Equation 1]}$$

where, ZP is a zeta potential of the polishing composition,

AC1 is an amount of the amine group contained in the amine-based surface modifier in weight percent based on the total composition weight, and AC2 is an amount of the amine group contained in the amine-based polishing rate improver in weight percent based on the total composition weight.

The polishing strength index may be a degree of bonding between the polishing composition and the object to be polished caused by an amine group contained in the polishing composition and a zeta potential.

The denominator for calculating the polishing strength index is a reference value for correcting the values for the zeta potential, the amount of an amine group contained in the amine-based surface modifier in weight percent based on the total composition weight, and the amount of an amine group contained in the amine-based polishing rate improver in weight percent based on the total composition weight.

Specifically, in the polishing composition, the amine group contained in the amine-based surface modifier and the amine-based polishing rate improver forms a bond with the boron-doped polysilicon film. The zeta potential of the polishing composition is a numerical concept for the degree of formation of such bond, and the abrasive strength index may be utilized in order to confirm the zeta potential, the effect of improving the polishing rate, and the effect of preventing the occurrence of defects by the amount of the amine group contained in the amine-based surface modifier and the amine-based polishing rate improver. For example, when the polishing composition for a semiconductor process in which the polishing strength index satisfies the above-mentioned range is used in a boron-doped polysilicon film, it is possible to exhibit a high level of polishing performance and prevent the occurrence of defects due to the polishing process by the influence of the zeta potential, the amount of the amine group contained in the amine-based surface modifier, and the amount of the amine group contained in the amine-based polishing rate improver.

In the case of boron-doped polysilicon film (BDPSi) in which boron is used as a dopant, physical strength increases as the content of boron increases so that there may be a problem in that the polishing rate is relatively low when performing the CMP process. In order to solve such a problem, an amine-based surface modifier or an amine-based polishing rate improver containing an amine group may be used in the polishing composition. When the content of the amine group is within an appropriate range based on the total weight of the polishing composition, the polishing rate may be increased as the bonding force between the boron-doped polysilicon film and the polishing composition is increased due to the amine having a relatively positive charge compared to boron.

The amine group content of the polishing composition for a semiconductor process may be designed by comprehensively adjusting an amine-based surface modifier, an amine-based polishing rate improver, a pH adjuster, a surfactant, a silicon nitride polishing inhibitor, and the like in the abrasive particles.

In one embodiment of the present disclosure, the amine-based surface modifier contains a hydrophilic group, and thus increases the polishing rate when polishing an object to be polished, but a surface modifier role of the abrasive particles is large. Meanwhile, the amine-based polishing rate improver has a hydrophilic group. The hydrophilicity of the hydrophilic group of the polishing rate improver is relatively higher than that of the hydrophilic group of the amine-based surface modifier. Therefore, since the amine-based polishing rate improver has high bonding strength with the object to be polished even in water, it is much more effective in increasing the polishing rate when polishing the object to be polished. The polishing rate improver may partially cause a chemical reaction on the surface of the semiconductor substrate. Therefore, since the polishing composition according to the present embodiment contains the amine-based surface modifier and the amine-based polishing rate improver in an appropriate amount based on the total weight of the polishing composition, defects and variations in the polishing rate that may be caused by a chemical reaction occurring on the surface of the semiconductor substrate may be reduced. Specifically, the boron-doped polysilicon film exhibiting a negative charge is bonded to an amine group exhibiting a positive charge in the amine-based polishing rate improver, and $H_2O$ is formed by the bonding. The bonding may prevent the adsorption of foreign substances due to a surface protection effect on the boron-doped polysilicon film, and weaken the Si—Si bond in the polysilicon film, thereby improving the polishing rate.

In the polishing composition, additives, surfactants, etc. may be added in addition to the amine-based polishing rate improver, and thus the pH of the polishing composition may change. The polishing composition may have a pH of 1.8 to 5, a pH of 2.2 to 4.5, a pH of 2.3 to 4, or a pH of 2.35 to 2.5. When the acidic environment is maintained within the above range, the polishing rate and quality may be maintained to a certain level or higher while preventing excessive corrosion of metal components or polishing device.

The polishing composition for a semiconductor process according to one embodiment of the present disclosure may further comprise a silicon nitride inhibitor and a surfactant.

The silicon nitride inhibitor is contained in order to use the silicon nitride film as a polishing stop layer during a polishing process. The polishing stop layer may be generally formed directly on a semiconductor substrate, or may be formed with other structure such as an electrode, a conductive film, a conductive film pattern, an insulating film, or an insulating film pattern being interposed therebetween. In general, a polishing target film is formed on the polishing stop layer. The polishing process is performed on the polishing target film until the top surface of the polishing stop layer is exposed in the polishing process.

That is, in the present disclosure, the polishing target film is a boron-doped polysilicon film, and the polishing stop layer is a silicon nitride film. The polishing process for the boron-doped polysilicon film may be stopped by the exposure of the polishing stop layer.

In order to suppress polishing of the silicon nitride film, the polishing composition for a semiconductor process of the present disclosure comprises a silicon nitride inhibitor, wherein the silicon nitride inhibitor may be selected from the group consisting of polyacrylic acid, polyphosphoric acid, polymaleic acid, polymethacrylic acid, polyacrylamide-co-acrylic acid, polyacrylic acid-co-maleic acid, polyacrylamide-co-acrylic acid, and mixtures thereof, and is preferably polyacrylic acid, but is not limited to the above examples, and any component that can be used as a polishing inhibitor by a person skilled in the art can be used without limitation.

The silicon nitride inhibitor is contained in an amount of 0.05 to 0.13% by weight, preferably 0.06 to 0.10% by weight, based on the total weight of the polishing composition for a semiconductor process. When used by mixing within the above range, polishing of the silicon nitride film is suppressed so that the polishing selectivity of the silicon nitride film with respect to the boron-doped polysilicon film may be adjusted.

The surfactant may be a nonionic surfactant.

The nonionic surfactant may be polyethylene glycol, polypropylene glycol, polyethylene-propylene copolymer, polyalkyl oxide, polyoxyethylene oxide (PEO), polyethylene oxide, or polypropylene oxide, and a fluorosurfactant may be selected from the group consisting of a sodium sulfonate fluorosurfactant, a phosphate ester fluorosurfactant, an amine oxide fluorosurfactant, a betaine fluorosurfactant, an ammonium carboxylate fluorosurfactant, a stearate ester fluorosurfactant, a quaternary ammonium fluorosurfactant, an ethylene oxide/propylene oxide fluorosurfactant, and a polyoxyethylene fluorosurfactant.

The surfactant may be contained in an amount of 0.0015 to 0.005% by weight, preferably 0.0015 to 0.003% by weight, based on the total weight of the polishing composition for a semiconductor process. When used by mixing within the above range, it is possible to suppress the occurrence of defects on the wafer surface due to the polishing process. Specifically, excellent polishing performance may be exhibited, and defect occurrence may be prevented at the same time, and a high level of surface roughness may also be exhibited by containing the surfactant within the above range. Further, it is possible to prevent the generation of bubbles when the polishing composition is prepared, thereby enabling preparation efficiency to be improved.

The polishing composition of the present disclosure may comprise a pH adjuster, wherein the pH adjuster may be at least one selected from the group consisting of hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, aspartic acid, tartaric acid, and potassium hydroxide.

The pH adjuster may be contained in an amount of 0.01 to 0.05% by weight based on the total weight of the polishing composition for a semiconductor process. The polishing composition for a semiconductor process may have a pH of 2 to 5, preferably 2 to 3. When the acidic environment is maintained within such a range, the polishing rate and quality may be maintained to a certain level or higher while preventing excessive corrosion of metal components or polishing device.

The polishing composition for a semiconductor process according to one embodiment of the present disclosure is characterized in that the boron-doped polysilicon film has an etching rate of 1,000 Å/min or more, and the silicon nitride film has an etching rate of 100 Å/min or less.

Specifically, in the polishing composition of the present disclosure, the boron-doped polysilicon film has an etching rate of 1,000 to 20,000 Å/min or more, preferably 1,500 to 10,000 Å/min or more, and more preferably 2,000 to 4,000 Å/min or more. When the etching rate is shown to be within the above range, excellent etching performance for the boron-doped polysilicon film may be exhibited, thereby reducing the polishing time, which may reduce the process time, thereby enabling the process yield to be improved.

Further, the silicon nitride film is characterized in that it has an etching rate of 10 to 100 Å/min or less, preferably 20 to 70 Å/min or less, which shows a low etching rate for the silicon nitride film, and thus the silicon nitride film may act as a polishing stop layer.

Specifically, when the etching rate is shown to be within the above range for the boron-doped polysilicon film when performing the polishing process using the polishing composition of the present disclosure as described above, the polishing performance for the boron-doped polysilicon film may be increased, and when the etching rate for the silicon nitride film is shown to be within the above range, it may act as a polishing stop layer, thereby preventing the occurrence of process defects such as dishing and erosion.

The polishing composition for a semiconductor process of the present disclosure is characterized by having a polishing selectivity of the silicon nitride film (SiN) to the boron-doped polysilicon film of 1:50 to 1:600, preferably 1:50 to 1:200, and more preferably 1:50 to 1:100. Specifically, the polishing rate of the boron-doped polysilicon film is increased, and the silicon nitride film is a polishing stop layer, and thus a low polishing rate should be exhibited. When the polishing selectivity is within the above range, a high level of polishing efficiency may be exhibited for the boron-doped polysilicon film, and the silicon nitride film may act as a polishing stop layer, thereby preventing the occurrence of process defects such as dishing and erosion.

In order to show the polishing selectivity of the polishing composition of the present disclosure, the semiconductor substrate is specifically a 300 mm wafer with a silicon nitride film (SiN) thickness of 1,500 Å by depositing SiN on a bare silicon wafer.

Specifically, a boron-doped polysilicon film is polished using a silicon nitride film as a polishing stop layer. As in the present disclosure, a high-quality polishing surface may be provided by adjusting the polishing selectivity of the silicon nitride film (SiN) to the boron-doped polysilicon film to minimize the process defects.

The polishing composition for a semiconductor process according to one embodiment of the present disclosure comprises a solvent as a remaining component except for each of the components described above and each additional component to be described later. The solvent may be water, and preferably ultrapure water is applied. The solvent may be contained in the content range of the remainder for the content range of the abrasive particles, the surface modifier, the polishing rate improver, the pH adjuster, the surfactant, and the polishing inhibitor.

The composition for a semiconductor process may have a solid content of about 5% by weight to about 20% by weight. When the composition for the semiconductor process satisfies the solid content of the above range while comprising each of the above-described components and the solvent, it may be advantageous to inject the composition for the semiconductor process at a uniform flow rate when applying the composition to the polishing process. Further, it may be advantageous to ensure uniform dispersibility and storage stability in the process of distribution and storage of the composition for the semiconductor process.

Figure 1:
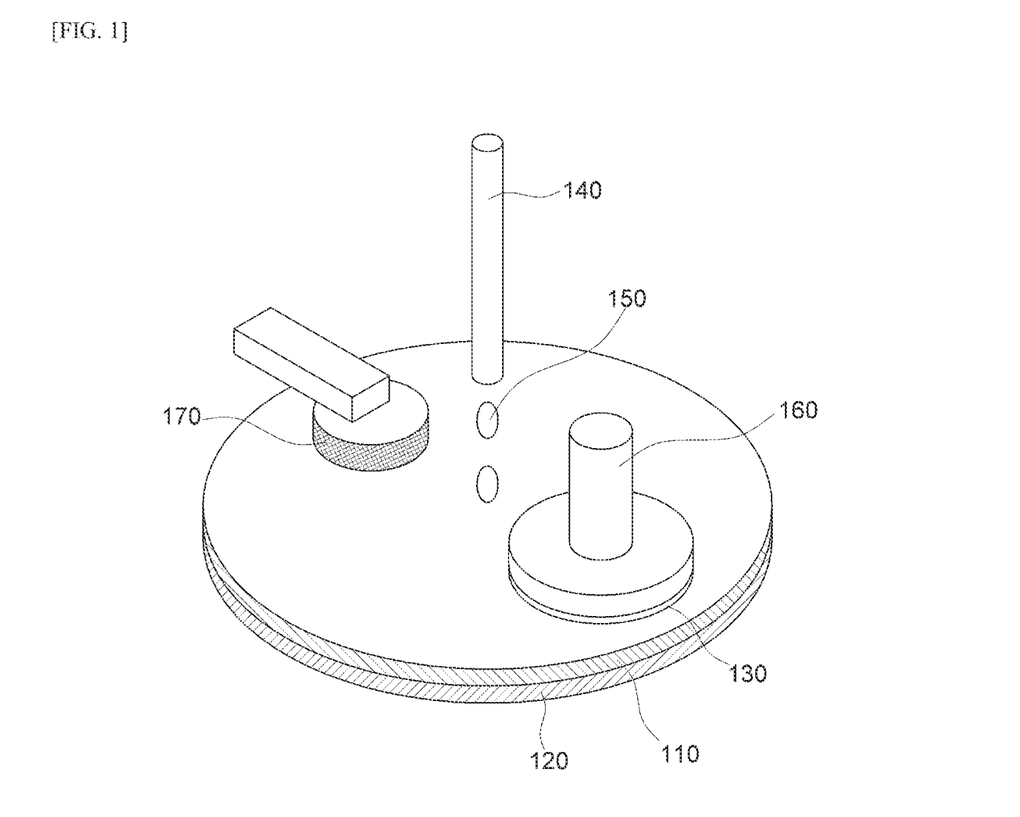
FIG. 1 shows a schematic process chart of a semiconductor device manufacturing process according to one embodiment of the present disclosure.

FIG. 1 shows a schematic process chart of a semiconductor device manufacturing process according to one embodiment. Referring to FIG. 1, after the polishing pad 110 according to the one embodiment is mounted on the surface plate 120, a semiconductor substrate 130 that is a polishing target is disposed on the polishing pad 110. For polishing, the polishing slurry 150 is sprayed on the polishing pad 110 through the nozzle 140.

The flow rate of the polishing slurry 150 supplied through the nozzle 140 may be selected according to the purpose within the range of about 10 cm$^3$/min to about 1,000 cm$^3$/min, and it may be, for example, about 50 cm$^3$/min to about 500 cm$^3$/min, but is not limited thereto.

The surface to be polished of the semiconductor substrate 130 is in direct contact with the polishing surface of the polishing pad 110.

Thereafter, the semiconductor substrate 130 and the polishing pad 110 are rotated relative to each other so that the surface of the semiconductor substrate 130 may be polished. In this case, the rotation direction of the semiconductor substrate 130 and the rotation direction of the polishing pad 110 may be the same direction or opposite directions. The rotation speeds of the semiconductor substrate 130 and the polishing pad 110 may each be selected from the range of about 10 rpm to about 500 rpm depending on the purpose, and they may be, for example, about 30 rpm to about 200 rpm, but are not limited thereto.

As an example of the polishing process of the semiconductor substrate, polishing the substrate may be simultaneously exposing three types of films such as a silicon oxide film (SiO$_2$) and a titanium/titanium nitride film that is used as a barrier metal film as well as a tungsten (W) film in the case of a tungsten barrier metal layer CMP process. The polishing composition for a semiconductor process of the present disclosure may be applied to a polishing process for a substrate in which the boron-doped polysilicon film is exposed.

A detailed description of the polishing composition for a semiconductor process overlaps with the description made above, and thus the description thereof will be omitted.

In one embodiment, the method for manufacturing the semiconductor device may comprise steps of: providing a semiconductor substrate 130 including a boron-doped polysilicon layer; preparing a polishing composition for a semiconductor process comprising: water, abrasive particles; and an amine-based polishing rate improver, and containing 0.0185% by weight or more of an amine group; and polishing the boron-doped polysilicon layer using the polishing composition.

Specifically, the semiconductor substrate 130 may include a boron-doped polysilicon film and a silicon nitride film.

Figure 2:
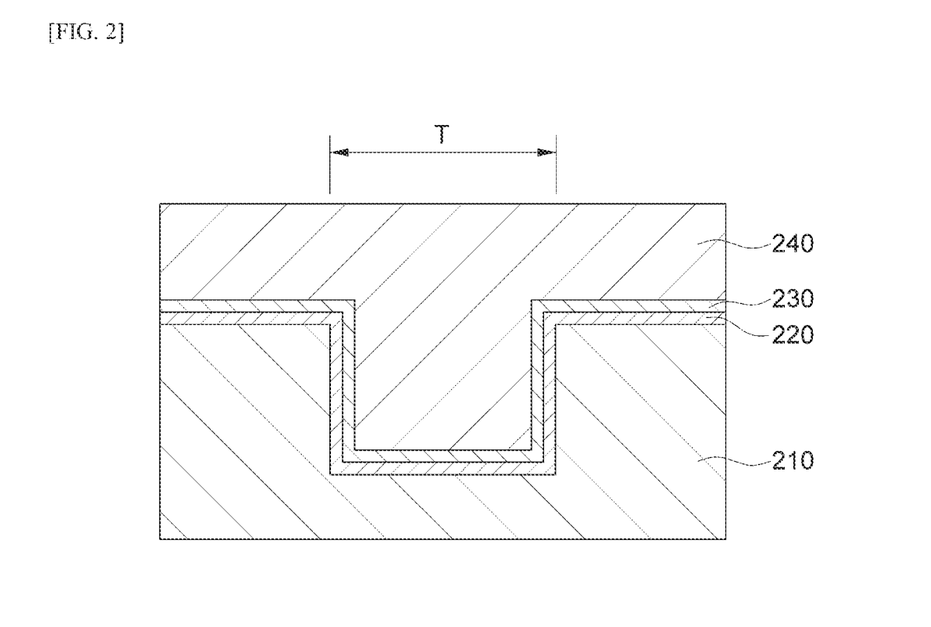
FIG. 2 is a cross section of a semiconductor substrate including a boron-doped polysilicon film and a silicon nitride film before a polishing process according to one embodiment of the present disclosure.
Figure 3:
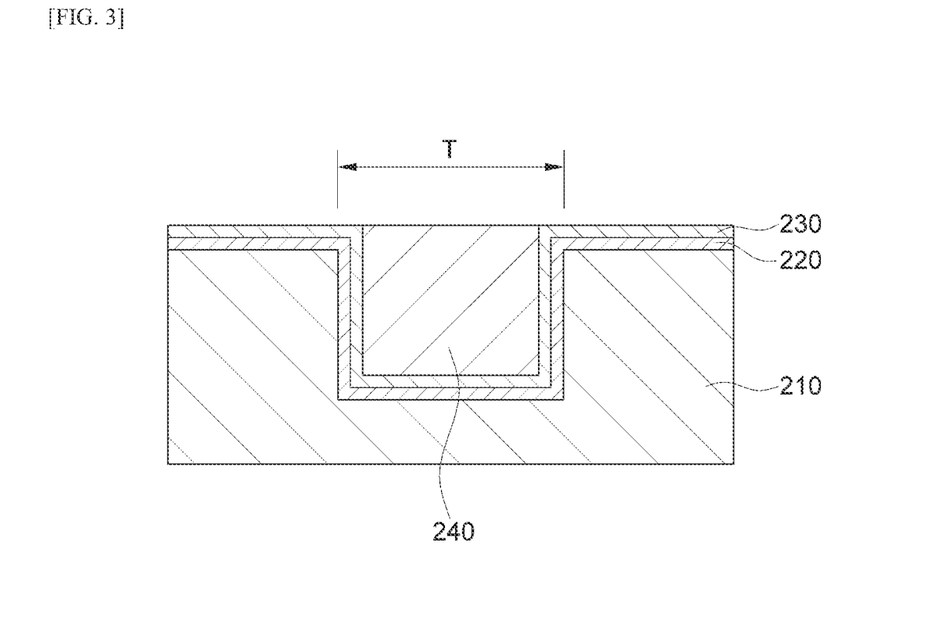
FIG. 3 is a cross section of a semiconductor substrate including a boron-doped polysilicon film and a silicon nitride film polished using a polishing composition for a semiconductor process according to one embodiment of the present disclosure.

The method for manufacturing the semiconductor device may be confirmed more specifically through FIGS. 2 and 3. FIG. 2 is a cross section of a semiconductor substrate including a boron-doped polysilicon film 240 and a silicon nitride film 230 before a polishing process, and FIG. 3 is a cross section of a semiconductor substrate including a boron-doped polysilicon film 240 and a silicon nitride film 230 polished using a polishing composition for a semiconductor process according to one embodiment of the present disclosure.

Referring to FIG. 2, the semiconductor substrate has a trench having a vertical wall surface formed therein, having a silicon wafer 210, a silicon oxide film 220, and a silicon nitride film 230 stacked therein, and having a boron-doped polysilicon film 240 deposited thereon. The semiconductor substrate of FIG. 2 is subjected to the polishing process using the polishing composition of the present disclosure, and thus the boron-doped polysilicon film 240 is polished as shown in FIG. 3. The polishing composition of the present disclosure exhibits a high polishing rate with respect to the boron-doped polysilicon film 240, and the silicon nitride film 230, as a polishing stop layer, exhibits a low polishing rate. Due to the aforementioned characteristics, when performing polishing using the polishing composition of the present disclosure, the polishing process is completed when the silicon nitride film 230 is exposed. The method for manufacturing a semiconductor device may provide a high-quality polishing surface by using the polishing composition of the present disclosure to adjust the polishing selectivity of the silicon nitride film (SiN) to the boron-doped polysilicon film 240 as shown in FIGS. 2 and 3, thereby minimizing process defects.

EXAMPLE

Preparation of Composition for Semiconductor Polishing

Colloidal silica was used as metal oxide particles. The colloidal silica was prepared by reacting it with 3-aminopropyltriethoxysilane as a surface modifier so that an amino silane compound is bonded to its surface.

Compositions for semiconductor polishing were prepared using ultrapure water as a solvent, glycine as a polishing rate improver, acetic acid and/or potassium hydroxide as a pH adjuster, polyethylene glycol and/or a fluorosurfactant as a surfactant and, polyacrylic acid as a polishing inhibitor.

The compositions were prepared by mixing the components in the ranges as shown in Table 1 below, and the rest were all ultrapure water.

The sizes (nm), pH values, viscosities (cP), and zeta potentials of the abrasive particles for the prepared polishing compositions for a semiconductor process are as shown in Table 2 below.

Specifically, the average particle diameters were measured by a dynamic light scattering particle size analyzer:
Equipment Company: Malvern
Model Name: Nano-ZS
Substance input: Colloidal Silica
Refractive index input: 1.457

After inputting the above-described information, the polishing compositions were diluted to a concentration of 0.5% by weight, the diluted polishing compositions were injected into the size distribution cell in an amount of 5 ml, and the average diameters of the particles were measured. The particle distribution values were measured for a total of 3 sets based on 1 set of 10 times, and the average values were recorded.

The zeta potentials were measured using the same ZETA-SIZER Nano-ZS90 (Malvern Instruments) as equipment for measuring the average particle diameters. The stock solutions of the polishing compositions were injected into the zeta sizer cell in an amount of within 10 ml, and the analysis was carried out after sealing. The average zeta potential values of 10 times were recorded.

pH values were measured using Horiba's conductivity/pH dual measuring equipment, the calibration was carried out for each of pH values of 4, 7, and 10, conductivity values were also calibrated using a 1013 uS-cm solution, and then the resulting values were derived as the average values of 5 measurements.

In the case of viscosity, the viscosity of each stock solution of the slurry sample was measured using AND's vibration type viscometer. Specifically, measurement was performed after performing calibration using DI water (1 cp). 35 ml of the slurry was put in a 45 ml cuboid cell and the sample container was fixed to the measuring equipment. It was fixed after adjusting the height by slowly lowering the viscosity measuring sensor to the extent that it does not come into contact with the liquid level. After moving the

TABLE 1

| | Content of metal oxide particles | Surface modifier (amine group content (% by weight)) | Polishing rate improver (amine group content (% by weight)) | pH adjuster | Total amine group content (% by weight) | Surfactant | Polishing inhibitor |
|---|---|---|---|---|---|---|---|
| Example 1 | 10 | 0.2 (0.0145) | 0.05 (0.01067) | 0.02 | 0.02517 | 0.002 | 0.08 |
| Example 2 | 10 | 0.2 (0.0145) | 0.075 (0.016) | 0.02 | 0.0305 | 0.002 | 0.08 |
| Example 3 | 10 | 0.2 (0.0145) | 0.05 (0.01067) | 0.02 | 0.02517 | 0.001 | 0.08 |
| Example 4 | 10 | 0.2 (0.0145) | 0.1 (0.02133) | 0.02 | 0.03583 | 0.002 | 0.08 |
| Example 5 | 10 | 0.2 (0.0145) | 0.025 (0.005333) | 0.02 | 0.01983 | 0.002 | 0.08 |
| Example 6 | 10 | 0.4 (0.0290) | 0.05 (0.01067) | 0.02 | 0.03967 | 0.002 | 0.04 |
| Comparative Example 1 | 10 | 0.1 (0.00724) | 0.05 (0.01067) | 0.02 | 0.01791 | 0.002 | 0.08 |

(unit: % by weight)

Experimental Example 1

Evaluation of Physical Properties of Polishing Compositions for Semiconductor Process knob to which the sample container is fixed and positioning the sample container so that the liquid level was placed in the center of the concave part of the viscosity measuring sensor, measurement was performed for 30 seconds.

The polishing strength indices were calculated by the following Equation 1:

$$PSI = \frac{ZP}{20 \text{ mV}} \times \frac{AC1}{0.01 \text{ wt \%}} \times \frac{AC2}{0.01 \text{ wt \%}} \quad \text{[Equation 1]}$$

where,

ZP is a zeta potential of the polishing composition,

AC1 is an amount of the amine group contained in the amine-based surface modifier in weight percent based on the total composition weight, and AC2 is an amount of the amine group contained in the amine-based polishing rate improver in weight percent based on the total composition weight.

The measurement results of the physical properties are as shown in Table 2 below.

Experimental Example 2

Evaluation of Polishing Performance of Polishing Compostions for Semiconductor Process (1) Polishing Evaluation Polishing evaluation was performed on a boron-doped polysilicon film having a wafer diameter of 300 mm and a thickness of about 6,000 Å (average roughness immediately after deposition Ra=16 Å). Specifically, an SKC's HD-319B pad with a diameter of 30 inches and a thickness of 3 T was used as the polishing pad, and polishing was performed under the conditions of a pressure of 3.0 psi, a carrier speed of 103 rpm, a platen speed of 97 rpm, and a slurry flow rate of 300 ml/min for 60 seconds, and at the same time, conditioning was performed at a pressure of 5 lbs, a speed of 200 rpm, and a level of 5 minutes.

Additional polishing evaluation was performed on a silicon nitride film having a thickness of about 1,500 Å under the same polishing conditions.

After the polishing process was performed, the thickness of each wafer was measured, and the polishing rate (polishing speed; A/min) of the corresponding slurry composition was calculated therefrom.

(2) Defect Measurement

After performing polishing under the same conditions as in the CMP evaluation, a cleaning process was performed using a self-prepared cleaning chemical solution at a brush rotation speed of 500 rpm and chemical spraying conditions of 60 s and 2000 cc/min. In a state that the boron-doped polysilicon film and un-doped polysilicon film that had completed the cleaning process were sealed, the total number of defects were measured using AIT-XP+ equipment owned by SKC.

(3) Measurement of Roughness (Ra)

AFM measurement was performed using a 300 mm wafer on which defect measurement was completed. In the case of AFM measurement progress conditions, the average values of the Ra results measured 5 times at each position of 0 mm, −75 mm, +75 mm, −150 mm, and +150 mm in the 300 mm wafer position (−150 mm to +150 mm) area were calculated.

The measurement results for the polishing performance are as shown in Table 2 below.

TABLE 2

| | | Example 1 | Example 2 | Example 3 | Example 4 | Example 5 | Example 6 | Comparative Example 1 |
|---|---|---|---|---|---|---|---|---|
| Physical properties | Particle size (nm) | 44 | 45 | 44 | 46 | 42 | 44 | 44 |
| | pH | 2.4 | 2.4 | 2.4 | 2.4 | 2.4 | 2.4 | 2.4 |
| | Zeta potential (mV) | 22 | 21 | 22 | 22 | 23 | 34 | 14 |
| | Viscosity (cP) | 1.32 | 1.30 | 1.28 | 1.31 | 1.3 | 1.32 | 1.33 |
| | Polishing strength index (PSI) | 1.70 | 2.43 | 1.70 | 3.40 | 0.89 | 5.26 | 0.54 |
| Polishing performance | BDPSi etching rate (Å/min) | 2629 | 2944 | 2543 | 3221 | 984 | 2140 | 355 |
| | SiN etching rate (Å/min) | 23 | 28 | 24 | 65 | 47 | 113 | 35 |
| | Defects of BDPSi film (ea) | 62 | 77 | 423 | 61 | 66 | 224 | 64 |
| | Roughness of BDPSi film (Ra, Å) | 0.6 | 0.7 | 12.3 | 14.2 | 0.7 | 5.1 | 0.5 |
| | Polishing selectivity (BDPSi/SiN) | 114 | 105 | 105 | 49 | 21 | 19 | 10 |

According to Table 2 above, in Examples 1 and 2 in which the polishing strength indices (PSI) by the amine group content and the zeta potential were 1.70 and 2.43 respectively, it was confirmed that the etching rate of the boron-doped polysilicon film (BDPSi) exceeded 2,000 Å/min, and the etching rate of a SiN film was 100 Å/min or less in the polishing performance evaluation, indicating excellent polishing performance, and exhibiting excellent effects even in the evaluation of defects and surface roughness.

Specifically, the present disclosure is a polishing composition in which the etching rate of the boron-doped polysilicon film has a polishing rate of at least more than 1,000 Å/min, and a defect level of 100 ea or less, and it is also characterized by having a polishing rate as low as possible for the SiN film.

If the SiN film does not have a low level of polishing rate, when the boron-doped polysilicon film and the SiN film are exposed at the same time during the polishing process, the SiN film does not play a role as a polishing stop layer, and thus a problem in which it is difficult to adjust the thickness of a target with respect to the film may occur. Further, dishing may be caused by a difference in polishing selectivity. Even in the evaluation of surface roughness, it should be adjusted to 1 nm or less so that it is not recognized as a defect in the subsequent process.

Further, in the case of Examples 3 and 4, the boron-doped polysilicon film exhibited a high level of etching rate of 2,000 Å/min or more, and the SiN film also exhibited an etching rate of 100 Å/min or less, confirming that it acted as a polishing stop layer.

Example 5 confirmed that after the polishing process was completed, excellent effects were exhibited in the evaluation of defects and roughness in the boron-doped polysilicon film.

In the case of Example 6, it was confirmed that the boron-doped polysilicon film exhibited a high level of etching rate of 2,000 Å/min or more.

Considering the comprehensive part, Examples 1 and 2 exhibited a high level of etching rate for the boron-doped polysilicon film, and exhibited excellent effects on defects and roughness of the wafer surface after the polishing process. Further, it was confirmed that the silicon nitride film exhibited a low etching rate and could act as a polishing stop layer.

Contrary to this, compared to Examples, Comparative Example 1 has similar particle size and viscosity measurement results, but has a different zeta potential value and a low content of the amine-based surface modifier so that the content of the amine group in the total polishing composition is less than 0.0185% by weight, and even the result of calculating the polishing strength index deviates from 0.6 to 5 so that it can be confirmed that the etching rate of the boron-doped polysilicon film (BDPSi) is low.

Hereinabove, preferred embodiments of the present disclosure have been described in detail, but the right scope of the present disclosure is not limited thereto, and various modified and improved forms of those skilled in the art using the basic concept of the present disclosure defined in the following claims also belong to the right scope of the present disclosure.

EXPLANATION OF REFERENCE NUMERALS

110: Polishing pad
120: Surface plate
130: Semiconductor substrate
140: Nozzle
150: Polishing slurry
210: Silicon wafer
220: Silicon oxide film
230: Silicon nitride film
240: Boron-doped polysilicon film
T: Trench

What is claimed is:

1. A polishing composition for a semiconductor process, the polishing composition comprising:
   water;
   abrasive particles having an amine-based surface modifier bonded to the surface thereof;
   an amine-based polishing rate improver; and
   a silicon nitride inhibitor,
   wherein the silicon nitride inhibitor is selected from the group consisting of polyacrylic acid, polymaleic acid, polymethacrylic acid, polyacrylamide-co-acrylic acid, polyacrylic acid-co-maleic acid, polyacrylamide-co-acrylic acid, and mixtures thereof,
   wherein the polishing composition contains 0.0185% by weight or more of an amine group based on the total weight of the polishing composition,
   wherein the polishing composition has a zeta potential of 15 mV to 33 mV,
   wherein the polishing composition has a polishing strength index (PSI) represented by the following Equation 1 of 0.6 to 5:

$$PSI = \frac{ZP}{20 \text{ mV}} \times \frac{AC1}{0.01 \text{ wt \%}} \times \frac{AC2}{0.01 \text{ wt \%}} \quad \text{[Equation 1]}$$

wherein,
ZP is a zeta potential of the polishing composition,
AC1 is an amount of the amine group contained in the amine-based surface modifier in weight percent based on the total composition weight, and
AC2 is an amount of the amine group contained in the amine-based polishing rate improver in weight percent based on the total composition weight.

2. The polishing composition of claim 1, wherein the amine-based surface modifier is an amino silane.

3. The polishing composition of claim 2, wherein the amino silane is selected from the group consisting of 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis [3-(trimethoxysilyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopropyltrimethoxysilane, N-[3-(trimethoxysilyl)propyl]butylamine, and combinations thereof.

4. The polishing composition of claim 1, wherein the amine-based surface modifier is contained in an amount of 0.01% by weight to 0.5% by weight based on the total weight of the polishing composition for a semiconductor process.

5. The polishing composition of claim 1, wherein the polishing composition has a pH of 4 or less.

6. The polishing composition of claim 1, further comprising a surfactant.

7. The polishing composition of claim 1, wherein the silicon nitride inhibitor is contained in an amount of 0.05 to 0.13% by weight based on the total weight of the polishing composition for a semiconductor process.

8. The polishing composition of claim 6, wherein the surfactant is contained in an amount of 0.0015 to 0.005% by weight based on the total weight of the polishing composition for a semiconductor process.

9. The polishing composition of claim 1, wherein the abrasive particles have an average particle diameter of 30 nm to 50 nm and a viscosity of 1.20 cps to 1.40 cps.

10. The polishing composition of claim 1, wherein the polishing composition is used in a polishing process of a semiconductor substrate including a boron-doped polysilicon layer.

11. The polishing composition of claim 1, wherein the amine-based polishing rate improver is selected from the group consisting of glycine, β-alanine betaine, stearyl betaine, and mixtures thereof.

12. The polishing composition of claim 1, wherein the amine-based polishing rate improver is contained in an amount of 0.03 to 0.095% by weight based on the total weight of the polishing composition for a semiconductor process.

13. The polishing composition of claim 1, further comprising a pH adjuster.

* * * * *